(12) United States Patent
Tuan et al.

(10) Patent No.: US 8,099,691 B1
(45) Date of Patent: *Jan. 17, 2012

(54) DISABLING UNUSED/INACTIVE RESOURCES IN AN INTEGRATED CIRCUIT FOR STATIC POWER REDUCTION

(75) Inventors: Tim Tuan, San Jose, CA (US); Kameswara K. Rao, San Jose, CA (US); Robert O. Conn, Hakalau, HI (US)

(73) Assignee: Xilinx, Inc., San Jose, CA (US)

( * ) Notice: Subject to any disclaimer, the term of this patent is extended or adjusted under 35 U.S.C. 154(b) by 283 days.

This patent is subject to a terminal disclaimer.

(21) Appl. No.: 12/491,174

(22) Filed: Jun. 24, 2009

Related U.S. Application Data

(60) Continuation of application No. 11/502,939, filed on Aug. 11, 2006, now Pat. No. 7,562,332, which is a division of application No. 10/666,669, filed on Sep. 19, 2003, now Pat. No. 7,098,689.

(51) Int. Cl.
 *G06F 17/50* (2006.01)
(52) U.S. Cl. ......... 716/100; 716/116; 716/117; 716/133
(58) Field of Classification Search ............... 716/100, 716/116, 117, 133; 326/33, 40, 44
See application file for complete search history.

(56) References Cited

U.S. PATENT DOCUMENTS

| | | | |
|---|---|---|---|
| 4,962,341 A | 10/1990 | Schoeff | |
| 5,303,390 A | 4/1994 | Little | |
| 5,362,989 A | 11/1994 | Hennedy | |
| 5,519,663 A | 5/1996 | Harper et al. | |
| 5,568,062 A | 10/1996 | Kaplinsky | |
| 5,583,457 A | 12/1996 | Horiguchi | |
| 5,612,892 A | 3/1997 | Almulla | |
| 5,615,162 A | 3/1997 | Houston | |
| 5,682,107 A | 10/1997 | Tavana et al. | |
| 5,712,790 A | 1/1998 | Ditlow | |
| 5,801,548 A | 9/1998 | Lee et al. | |
| 5,811,962 A | 9/1998 | Ceccherelli | |
| 5,825,662 A | 10/1998 | Trimberger | |
| 5,832,286 A | 11/1998 | Yoshida | |
| 5,914,873 A | 6/1999 | Blish | |
| 5,946,257 A | 8/1999 | Keeth | |
| 5,958,026 A | 9/1999 | Goetting et al. | |
| 6,038,386 A | 3/2000 | Jain | |
| 6,114,843 A | 9/2000 | Olah | |
| 6,148,390 A | 11/2000 | MacArthur et al. | |
| 6,160,418 A | 12/2000 | Burnham | |
| 6,169,419 B1 | 1/2001 | De et al. | |
| 6,172,518 B1 | 1/2001 | Jenkins | |

(Continued)

OTHER PUBLICATIONS

US 6,981,160, 12/2005, Thaker et al. (withdrawn).

(Continued)

*Primary Examiner* — Sun Lin
(74) *Attorney, Agent, or Firm* — Thomas George

(57) ABSTRACT

A method of operating an integrated circuit ("IC") is disclosed. The method includes identifying one or more unused or inactive resources of the IC which will not be used in a circuit design or which are inactive during operation of the IC. The method also includes enabling resources of the IC which will be used in the circuit design, and also disabling one or more unused or inactive resources of the IC from one or more power supply terminals in response to configuration values which are stored in memory cells.

20 Claims, 4 Drawing Sheets

U.S. PATENT DOCUMENTS

| | | | |
|---|---|---|---|
| 6,208,171 | B1 | 3/2001 | Kumagai et al. |
| 6,384,626 | B2 | 5/2002 | Tsai et al. |
| 6,466,049 | B1 | 10/2002 | Diba et al. |
| 6,489,804 | B1 | 12/2002 | Burr |
| 6,583,645 | B1 | 6/2003 | Bennett et al. |
| 6,631,502 | B2 | 10/2003 | Buffet et al. |
| 6,710,612 | B2 | 3/2004 | Farnworth |
| 6,711,719 | B2 | 3/2004 | Cohn et al. |
| 6,747,478 | B2 | 6/2004 | Madurawe |
| 6,839,888 | B2 | 1/2005 | Gupta |
| 6,885,563 | B2 | 4/2005 | Panella |
| 6,920,627 | B2 | 7/2005 | Blodget et al. |
| 6,936,917 | B2 | 8/2005 | Lopata et al. |
| 6,937,496 | B2 | 8/2005 | Mizuno |
| 6,950,998 | B1 | 9/2005 | Tuan |
| 6,960,934 | B2 | 11/2005 | New |
| 6,968,467 | B2 | 11/2005 | Inoue et al. |
| 7,003,620 | B2 | 2/2006 | Avraham et al. |
| 7,078,932 | B2 | 7/2006 | Swami |
| 7,080,341 | B2 | 7/2006 | Eisenstadt et al. |
| 7,098,689 | B1 | 8/2006 | Tuan et al. |
| 7,109,748 | B1 | 9/2006 | Liu et al. |
| 7,112,997 | B1 | 9/2006 | Liang et al. |
| 7,135,886 | B2 | 11/2006 | Schlacter |
| 7,170,315 | B2 | 1/2007 | Bakker et al. |
| 7,313,706 | B2 | 12/2007 | Williams et al. |
| 7,313,708 | B2 | 12/2007 | Oshins |
| 7,345,944 | B1 | 3/2008 | Jenkins |
| 7,562,332 | B1 * | 7/2009 | Tuan et al. ............ 716/138 |
| 2003/0030326 | A1 | 2/2003 | Shenai et al. |
| 2003/0218478 | A1 | 11/2003 | Sani et al. |
| 2005/0091547 | A1 | 4/2005 | Hanrieder et al. |
| 2005/0201174 | A1 | 9/2005 | Klein |
| 2006/0053246 | A1 | 3/2006 | Lee |
| 2006/0069851 | A1 | 3/2006 | Chung et al. |
| 2006/0202713 | A1 | 9/2006 | Shumarayev |
| 2007/0001720 | A1 | 1/2007 | Li et al. |
| 2007/0164785 | A1 | 7/2007 | He |

OTHER PUBLICATIONS

Allen/Holberg, Chapter 10; "Bandgap Voltage Reference"; Apr. 12, 2000; downloaded on Jan. 3, 2006 from www.ece.utexas.edu/~holberg/lecture_notes/bandgap.pdf; pp. 1-5.

Intel Corporation, "Intel PXA27x Processor Family Power Requirements", Application Note, 2004, pp. 1-36, available from Intel Corporation (Santa Clara) Corporate Office, 2200 Mission College Blvd., Santa Clara, California 95052-8119.

Microchip Techology Inc.; "Micropower Voltage Supervisors"; MCP102/103/121/131; Copyright 2005; downloaded on Jan. 3, 2006 from ww1.microchip.com/downloads/en/DeviceDoc/21906b.pdf; pp. 1-28.

Nowka, Kevin J., A 32-bit PowerPC System-on-a-Chip With Support for Dynamic Voltage Scaling and Dynamic Frequency Scaling, Nov. 2002, pp. 1441-1447, vol. 37, No. 11, IEEE Journal of Solid-State Circuits, Available from IEEE; 3 Park Avenue, 17th Floor, New York, NY 10016-5997.

Texas Instruments—Datasheet BQ4011 (32×8 nonvolatile SRAM) May 1999 pp. 1-15.

Texas Instruments (BenchMARq)—Datasheet BQ4011 (32×8 nonvolatile SRAM) Aug. 1993 pp. 1-11.

Xilinx, Inc., "Spartan-3L Low Power FPGA Family", Preliminary Product Specification, DS313, Sep. 15, 2005, v1.1, pp. 1-10, available from Xilinx, Inc., 2100 Logic Drive, San Jose, CA 95124.-3L.

Xilinx, Inc., "Virtex-II Pro Platform FPGA Handbook"; published Oct. 14, 2002; available from Xilinx, Inc., 2100 Logic Drive, San Jose, CA 95124; pp. 19-71.

Mutoh, Shin'Ichiro et al., "1—V Power Supply High-speed Digital Circuit Technology with Multithreshold-Voltage CMOS", IEEE Journal of Solid-State Circuits, Aug. 1995, pp. 847-854, vol. 30, No. 8, available from IEEE, 3 Park Avenue, 17th Floor, New York, NY 10016-5997.

Inukai, T. et al., "Boosted Gate MOS (BGMOS): Device/Circuit Cooperation Scheme to Achieve Leakage-Free Giga-Scale Integration" IEEE 2000 Custom Integrated Circuits Conference, May 21-24, 2000, pp. 409-412, available from IEEE, 3 Park Avenue, 17th Floor, New York, NY 10016-5997.

Kuroda, Tadahiro et al., "A 0.9-V, 150-MHz, 10-mW, 4 mm2, 2-D Discrete Cosine Transform Core Processor With Variable Threshold-Voltage (VT) Scheme", Nov. 1996, pp. 1770-1779, vol. 32, No. 11, available from IEEE, 3 Park Avenue, 17th Floor, New York, NY 10016-5997.

Hamzaoglu, Fatih et al., "Circuit-Level Techniques to Control Gate Leakage for Sub-100nm CMOS", ISLPED, Aug. 12-14, 2002, pp. 60-63, available from IEEE, 3 Park Avenue, 17th Floor, New York, NY 10016-5997.

He, Lei, "Power Efficient FPGA: Circuit, Fabrics and CAD Algorithms," Presentation on Feb. 13, 2004, 50 pages, at Xilinx, Inc. 2100 Logic Drive, San Jose, CA 95124, available from EE Department, UCLA, at http://eda.ee.ucla.edu/.

FPGA 2004 Advance Program; ACM/SIGDA Eleventh international Symposium on Field Programmable Gate Arrays, Feb. 22-24, 2004, 6 pages, at Monterey Beach Hotel, Monterey, California, available at http://fpga2004.ece.ubc.ca/.

Takahashi, M. et al., "A 60-mW MPEG4 Video Codec Using Clustered Voltage Scaling with Variable Supply-Voltage Scheme," Nov. 1998, pp. 1772-1780, vol. 33, No. 11, available from IEEE Journal of Solid-State Circuits, IEEE, 3 Park Avenue, 17th Floor, New York, NY 10016-5997.

Park, Jae Y., Allen, Mark G., "A Comparison of Micromachined Inductors with Different Magnetic Core Materials"; 1996 Electronic Components and Technology Conference; 1996 IEEE; May 28-31, 1996, pp. 375-381.

Burd, Thomas D., et al., "A Dynamic Voltage Scaled Microprocessor System"; 2000 IEEE; IEEE Journal of Solid-State Circuits, vol. 35, No. 11, Nov. 2000; pp. 1571-1580.

Stratakos, Anthony J., et al., "A Low-Voltage CMOS DC-DC Converter for a Portable Battery-Operated System"; 1994 IEEE; Jun. 20-25, 1994, pp. 619-626.

Stratakos, Anthony John, "High-Efficiency Low-Voltage DC-DC Conversion for Portable Applications," Chapter 3; "DC-DC Converter Fundamentals"; Ph. D., UC, Berkeley, CA 1998, pp. 42-78.

U.S. Appl. No. 11/502,939, filed Aug. 11, 2006, Tuan, Tim, et al., Xilinx, Inc., San Jose, CA 95124.

U.S. Appl. No. 11/329,646, filed Jan. 11, 2006, Jenkins, Jesse H. IV, Xilinx, Inc., San Jose, CA.

U.S. Appl. No. 11/325,888, filed Jan. 4, 2006, Tuan, Tim, Xilinx Inc., San Jose, CA.

U.S. Appl. No. 11/268,265, filed Nov. 4, 2005, Rahman, Arifur, et al. , Xilinx, Inc., San Jose, CA.

U.S. Appl. No. 10/971,934, filed Oct. 22, 2004, Jenkins, Jesse H. IV, Xilinx, Inc., San Jose, CA 95124.

U.S. Appl. No. 10/783,589, filed Feb. 20, 2004, Look, Kevin T., et al., Xilinx, Inc., San Jose, CA 95124.

U.S. Appl. No. 10/783,216, filed Feb. 20, 2004, Tuan, Tim et al., Xilinx, Inc., San Jose, CA 95124.

U.S. Appl. No. 10/606,619, filed Oct. 26, 2003; New, Bernard et al., Xilinx, Inc., San Jose, CA 95124.

* cited by examiner

DISABLING UNUSED/INACTIVE RESOURCES IN AN INTEGRATED CIRCUIT FOR STATIC POWER REDUCTION

CROSS-REFERENCE TO RELATED APPLICATIONS

The present application is a continuation of U.S. patent application Ser. No. 11/502,939, filed Aug. 11, 2006 (now U.S. Pat. No. 7,562,332 issued Jul. 14, 2009), which is a divisional of U.S. patent application Ser. No. 10/666,669, filed Sep. 19, 2003 (now U.S. Pat. No. 7,098,689 issued Aug. 29, 2006).

FIELD OF THE INVENTION

The present invention relates to the disabling of unused and/or inactive blocks in an integrated circuit such as a programmable logic device to achieve lower static power consumption.

RELATED ART

Technology scaling of transistor geometry has resulted in a rapid increase of static power consumption in semiconductor devices. At the current rate of increase, static power consumption will become the dominant source of power consumption in the near future. In many applications, such as those powered by batteries, low static power consumption is a property of great importance, for example, due to the desirability of a long battery life.

Programmable logic devices (PLDs), such as field programmable gate arrays (FPGAs), have a significantly higher static power consumption than dedicated logic devices, such as standard-cell application specific integrated circuits (ASICs). A reason for this high static power consumption is that for any given design, a PLD only uses a subset of the available resources. The unused resources are necessary for providing greater mapping flexibility to the PLD. However, these unused resources still consume static power in the form of leakage current. Consequently, PLDs are generally not used in applications where low static power is required.

It would therefore be desirable to have a PLD having a reduced static power consumption.

SUMMARY

In accordance with one embodiment of the present invention, unused and/or inactive resources in an integrated circuit ("IC") such as a PLD are disabled to achieve lower static power consumption.

In one embodiment of the present invention, a method of operating an IC includes identifying one or more unused or inactive resources of the IC which will not be used in a circuit design or which are inactive during operation of the IC; enabling resources of the IC which will be used in the circuit design; and disabling one or more unused or inactive resources of the IC from one or more power supply terminals in response to configuration values which are stored in memory cells.

In this embodiment, the identifying one or more unused or inactive resources of the IC can comprise identifying one or more unused resources of the IC that are unassigned during a place and route process. The disabling the one or more unused or inactive resources of the IC can comprise disabling one or more resources of the IC which are temporarily inactive during operation of the IC. The disabling the one or more unused or inactive resources of the IC can comprise providing reduced voltage to the one or more unused or inactive resources of the IC. The disabling the one or more unused or inactive resources of the IC can comprise disabling, using switches, the one or more unused or inactive resources of the IC. The one or more power supply terminals can comprise a positive voltage supply terminal or a ground voltage supply terminal.

In this embodiment, the method can further comprise generating a configuration bit stream representing the circuit design, and configuring the IC using the configuration bit stream, where the disabling is performed in response to the configuration values of the configuration bit stream. In addition, the method can further comprise defining the configuration values during design time of the IC. Moreover, the method can further comprise defining user controlled signals during run time of the IC, and generating the user controlled signals in response to operating conditions of the IC during run time, where the act of disabling can comprise disabling one or more unused or inactive resources of the IC in response to the user controlled signals. The act of disabling can comprise turning off at least one transistor coupled between the one or more unused or inactive resources and the one or more power supply terminals. The one or more unused or inactive resources can be one or more unused or inactive programmable logic blocks.

An embodiment of an integrated circuit ("IC") comprises: one or more resources, one or more power controllers; each of the one or more power controllers coupled to a corresponding one of the one or more resources; a power supply coupled to the one or more power controllers; and one or more memory cells, each of the one or more memory cells coupled to a corresponding one of the one or more power controllers. The one or more memory cells are configured by a configuration bit stream to configure the one or more memory cells in order to enable or disable the corresponding one of the one or more resources based on whether the corresponding one of the one or more resources are unused or inactive in a circuit design.

In this embodiment, the one or more power controllers can be one or more switches or one or more switching regulators. The one or more resources can be unused or inactive if the one or more resources are temporarily inactive during operation of the IC. The power supply can comprise a positive voltage supply or a ground voltage supply. User logic can generate control signals to disable the one or more resources during operation of the IC. The memory cells can be configured during design time of the IC. The one or more resources of the IC can be one or more programmable logic blocks.

In yet another embodiment, a method to reduce the power consumed by an IC comprises: assigning components of a circuit design to resources of the IC; identifying one or more resources of the IC that are unused or inactive; during a design time, enabling resources of the IC which will be used in the circuit design; and during the design time, disabling one or more unused or inactive resources of the IC from one or more power supply terminals in response to configuration values which are stored in memory cells.

In this embodiment, the disabling the one or more unused or inactive resources of the IC can comprise disabling one or more resources of the IC which are temporarily inactive during operation of the IC.

The present invention will be more fully understood in view of the following description and drawings.

DETAILED DESCRIPTION

In accordance with one embodiment of the present invention, unused and inactive resources in a programmable logic device (PLD), such as a field programmable gate array (FPGA), are disabled to achieve lower static power consumption. The present invention includes both an enabling software flow and an enabling hardware architecture, which are described in more detail below. Unused resources of the PLD can be disabled when designing a particular circuit to be implemented by the PLD (hereinafter referred to as "design time"). In addition, resources of the PLD that are temporarily inactive can be disabled during operation of the PLD (hereinafter referred to as "run time").

Figure 1:
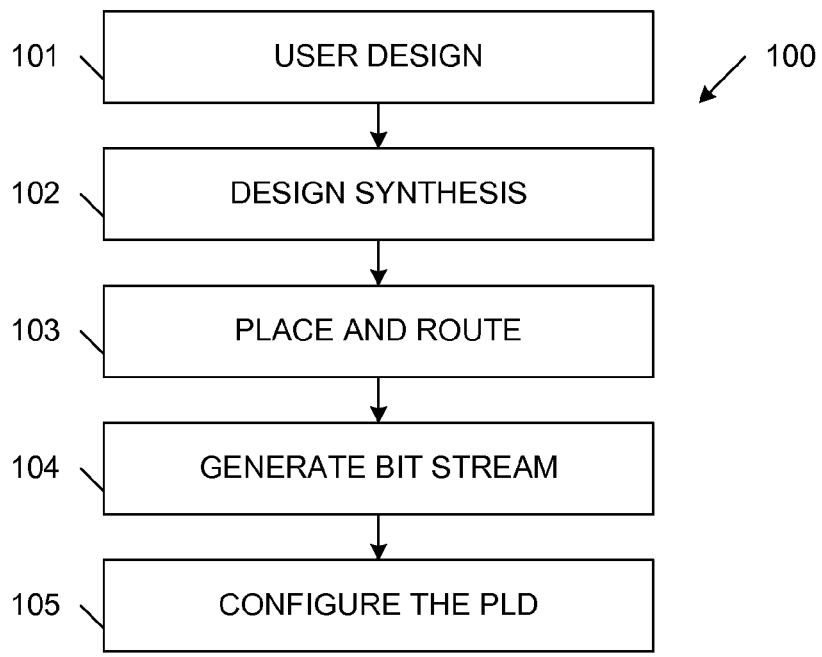
FIG. 1 is a flow diagram illustrating a conventional design flow used for PLDs.

FIG. 1 is a flow diagram 100 illustrating a conventional design flow used for PLDs. Initially, a user designs a circuit to be implemented by the PLD (Step 101). This user design is described in a high-level specification, such as Verilog or VHDL. The high-level specification is first synthesized to basic logic cells available on the PLD (Step 102). A place and route process then assigns every logic cell and wire in the design to some physical resource in the PLD (Step 103). The design is then converted into a configuration bit stream, in a manner known to those of ordinary skill in the art (Step 104). The configuration bit stream is then used to configure the device by setting various on-chip configuration memory cells (Step 105). While modern design flows may be much more complex, they all involve the basic steps defined by flow diagram 100.

In accordance with the present invention, unused resources of the PLD are identified during the design time, following the place and route process (Step 103). These unused resources are then selectively disabled during the design time. As described below, there are several ways to disable the unused resources. By selectively disabling the unused resources at design time, significant static power reduction may be achieved with no performance penalty.

Figure 2:
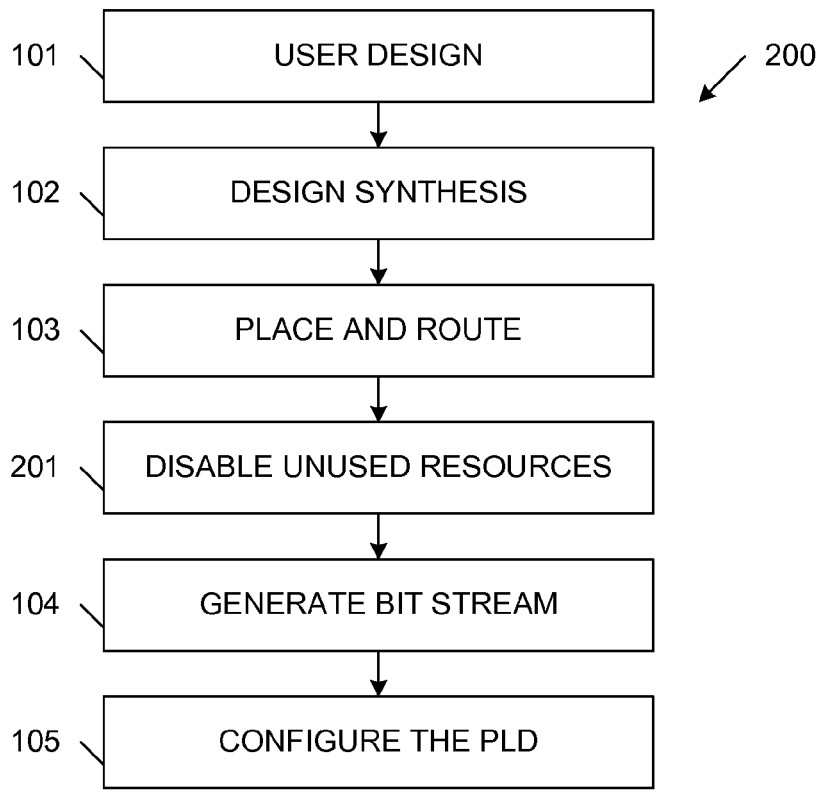
FIG. 2 is a flow diagram illustrating a design flow for a PLD in accordance with one embodiment of the present invention.

FIG. 2 is a flow diagram 200 illustrating a design flow in accordance with one embodiment of the present invention. Similar steps in flow diagrams 100 and 200 are labeled with similar reference numbers. Thus, flow diagram 200 includes Steps 101-105 of flow diagram 100, which are described above. In addition, flow diagram 200 includes the step of disabling unused resources in the PLD (Step 201). This step of disabling unused resources is performed after the place and route process has been completed in Step 103, and before the configuration bit stream is generated in Step 104. As described in more detail below, the unused resources are disabled by disabling predetermined programmable logic blocks of the PLD.

In another embodiment, further power savings are obtained by disabling temporarily inactive resources of the configured PLD during run time. Often, the entire design or parts of the design are temporarily inactive for some period of time. If the inactive period is sufficiently long, it is worthwhile to disable the inactive resources to reduce static power consumption. In a preferred embodiment, the decision of when to disable a temporarily inactive resource is made by the designer. In this embodiment, the user logic is provided access to a disabling mechanism, which enables the inactive resources to be disabled dynamically.

There are a number of techniques to disable resources in a PLD. In accordance with one embodiment, the PLD is logically subdivided into a plurality of separate programmable logic blocks. As described below, each programmable logic block may comprise one or more of the resources available on the programmable logic device. Switch elements are used to couple each of the programmable logic blocks to one or more associated voltage supply terminals (e.g., $V_{DD}$ or ground). The switch elements are controlled to perform a power-gating function, wherein unused and/or inactive programmable logic blocks are disabled (e.g., prevented from receiving power or receiving a reduced power). Preferably, only one of the voltage supply terminals ($V_{DD}$ or ground) is power-gated, thereby reducing the speed and area penalties associated with the switch elements. When the switch elements are controlled to de-couple the associated programmable logic blocks from the associated supply voltage, these programmable logic blocks are effectively disabled, thereby dramatically reducing the static power consumption of these blocks.

Figure 3:
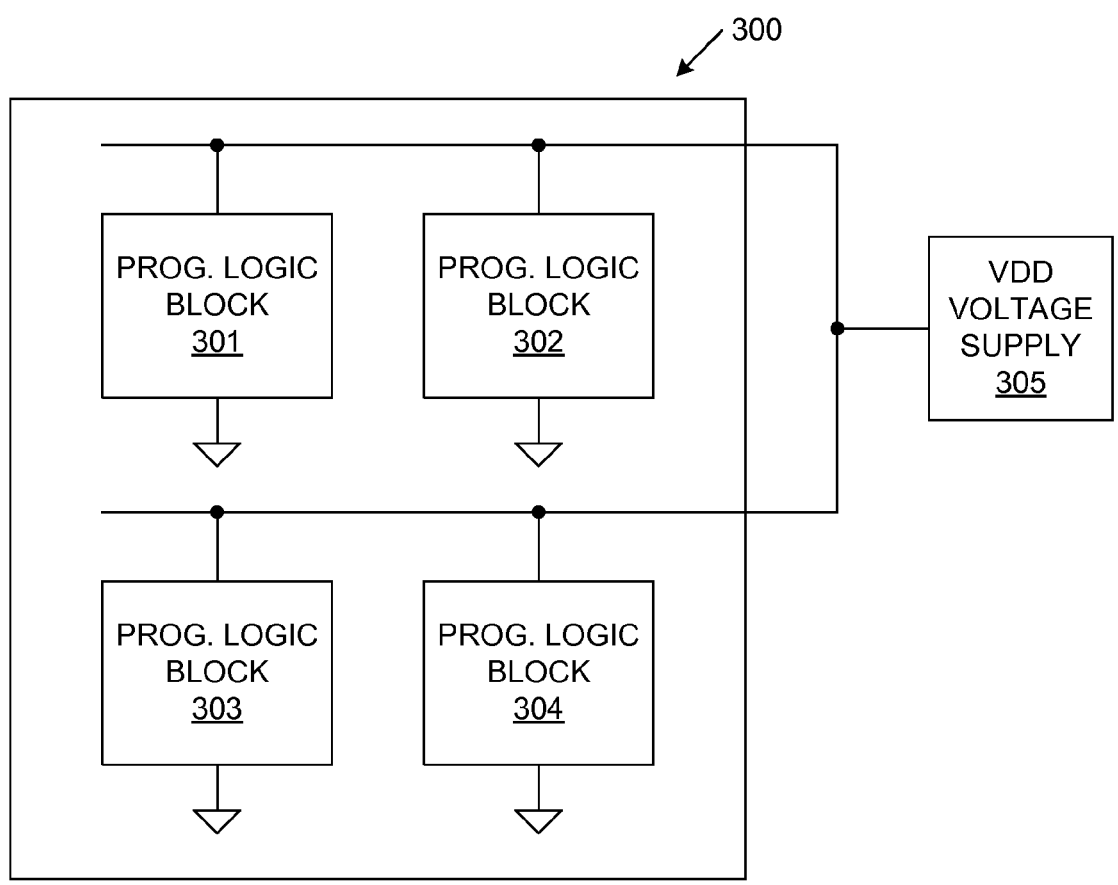
FIG. 3 is a block diagram of a conventional PLD having four blocks, which are all powered by the same off-chip $V_{DD}$ voltage supply.

FIG. 3 is a block diagram of a conventional PLD 300 having four programmable logic blocks 301-304, which are all powered by the same off-chip $V_{DD}$ voltage supply 305. Note that all four programmable logic blocks 301-304 are coupled to receive the $V_{DD}$ supply voltage during normal operating conditions, even if some of these blocks are not used in the circuit design.

Figure 4:
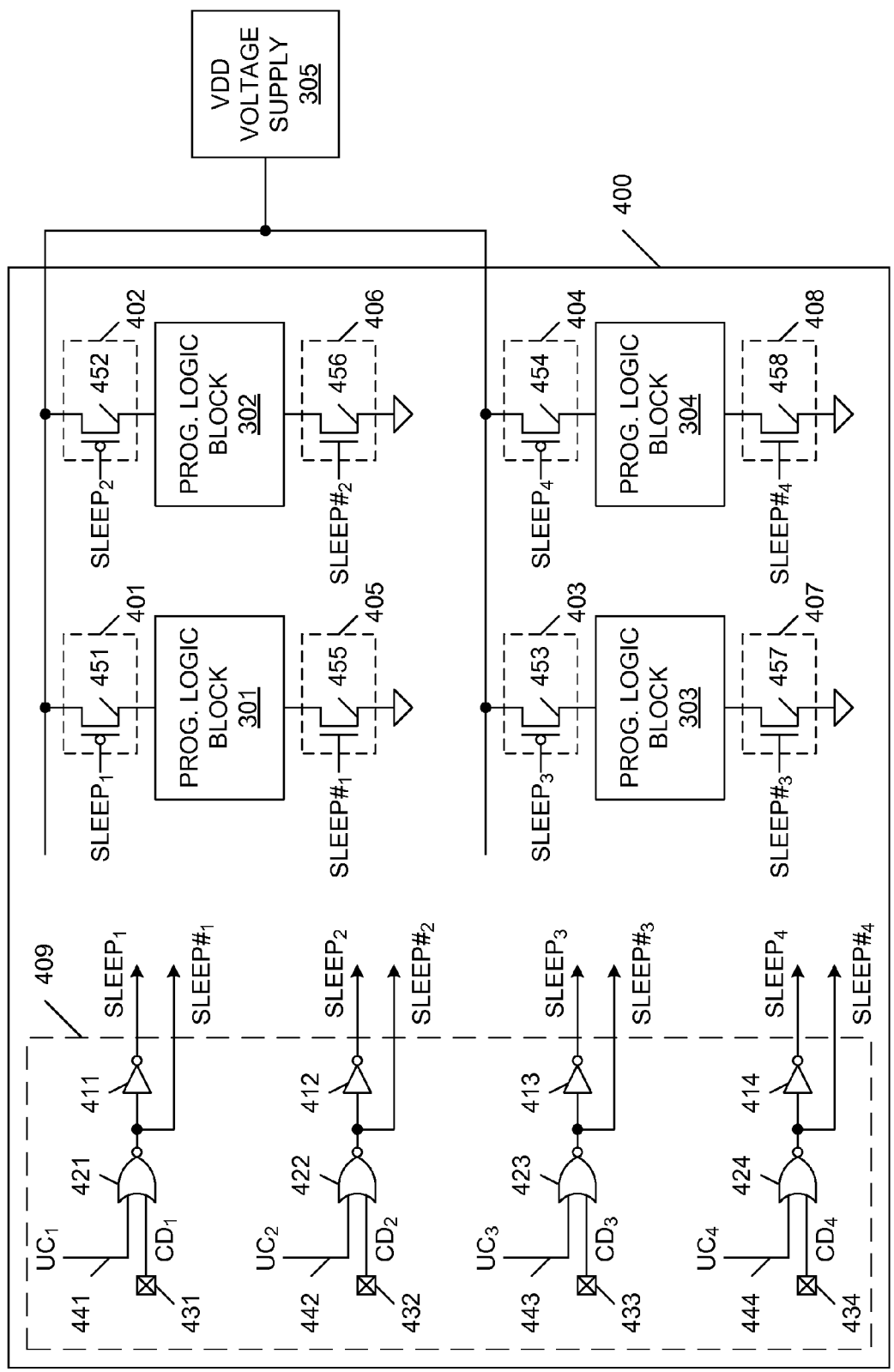
FIG. 4 is a block diagram of a PLD that implements power-gating switch elements in accordance with one embodiment of the present invention.

FIG. 4 is a block diagram of a PLD 400 in accordance with one embodiment of the present invention. Similar elements in FIGS. 3 and 4 are labeled with similar reference numbers. Thus, PLD 400 includes programmable logic blocks 301-304 and $V_{DD}$ voltage supply 305. In addition, PLD 400 includes switch elements 401-408, and control circuit 409. In the described embodiment, switch elements 401-404 are implemented by PMOS power-gating transistors 451-454, respectively, and switch elements 405-408 are implemented by NMOS power-gating transistors 455-458, respectively. In other embodiments, switch elements 401-408 may be any switch known to those ordinarily skilled in the art. Control circuit 409 is implemented by inverters 411-414, NOR gates 421-424, configuration memory cells 431-434, and user logic input terminals 441-444.

NOR gates 421-424 and inverters 411-414 are configured to generate power-gating control signals $SLEEP_1$-$SLEEP_4$ and $SLEEP\#_1$-$SLEEP\#_4$ in response to the configuration data values $CD_1$-$CD_4$ stored in configuration memory cells 431-434, respectively, and the user control signals $UC_1$-$UC_4$ provided on user logic input terminals 441-444, respectively.

For example, NOR gate 421 is coupled to receive configuration data value $CD_1$ from configuration memory cell 431 and user control signal $UC_1$ from user logic input terminal 441. If either the configuration data value $CD_1$ or the user control signal $UC_1$ is activated to a logic high state, then NOR gate 421 provides an output signal ($SLEEP\#_1$) having a logic "0" state. In response, inverter 411, which is coupled to the output terminal of NOR gate 421, provides an output signal ($SLEEP_1$) having a logic "1" state.

The $SLEEP_1$ signal is applied to the gate of PMOS power-gating transistor 451, which is coupled between block 301 and the $V_{DD}$ voltage supply terminal. The $SLEEP\#_1$ signal is applied to the gate of NMOS power-gating transistor 455, which is coupled between block 301 and the ground voltage supply terminal. The logic "0" state of the SLEEP#$_1$ signal causes NMOS power-gating transistor 455 to turn off, thereby de-coupling block 301 from the ground supply voltage terminal. Similarly, the logic "1" state of the SLEEP$_1$ signal causes PMOS power-gating transistor 451 to turn off, thereby de-coupling block 301 from the V$_{DD}$ supply voltage terminal. De-coupling block 301 from the V$_{DD}$ and ground supply voltage terminals effectively disables block 301, thereby minimizing the static leakage current in this block.

If both the configuration data value CD$_1$ and the user control signal UC$_1$ are de-activated to a logic low state, then NOR gate 421 provides a SLEEP#$_1$ signal having a logic "1" state, and inverter 411 provides a SLEEP$_1$ signal having a logic "0" state. The logic "1" state of the SLEEP#$_1$ signal causes NMOS power-gating transistor 455 to turn on, thereby coupling block 301 to the ground supply voltage terminal. Similarly, the logic "0" state of the SLEEP$_1$ signal causes PMOS power-gating transistor 451 to turn on, thereby coupling block 301 to the V$_{DD}$ supply voltage terminal. Coupling block 301 to the V$_{DD}$ and ground supply voltage terminals effectively enables block 301.

Programmable logic block 302 may be enabled and disabled in response to configuration data value CD$_2$ and user control signal UC$_2$, in the same manner as block 301. Similarly, programmable logic block 303 may be enabled and disabled in response to configuration data value CD$_3$ and user control signal UC$_3$, in the same manner as block 301. Programmable logic block 304 may be enabled and disabled in response to configuration data value CD$_4$ and user control signal UC$_4$, in the same manner as block 301.

As described above, when a programmable logic block is used and active, the associated power-gating transistors are turned on. Conversely, when a programmable logic block is unused or inactive, the associated power gating transistors are turned off. The SLEEP$_1$-SLEEP$_4$ and SLEEP#$_1$-SLEEP#$_4$ signals can be controlled by the configuration data values CD$_1$-CD$_4$ stored by configuration memory cells 431-434, which are best suited for disabling the associated blocks at design time. If a block is not disabled at design time, this block can be disabled at run time by the user control signals UC$_1$-UC$_4$, which may be generated by the user logic, or by other means.

In accordance with another embodiment of the present invention, some blocks have multiple supply voltages. In this case all of the supply rails should be power-gated to achieve maximum power reduction. In accordance with another embodiment, only one switch element may be associated with each block. That is, the blocks are power-gated by de-coupling the block from only one power supply terminal, and not both the V$_{DD}$ and ground supply voltage terminals, thereby conserving layout area.

The granularity of the power-gated programmable logic blocks can range from arbitrarily small circuits to significant portions of the PLD. The decision concerning the size of each programmable logic block is made by determining the desired trade-off between power savings, layout area overhead of the switch elements and the control circuit, and speed penalty. In a FPGA, each programmable logic block may be selected to include one or more configuration logic blocks (CLBs), input/output blocks (IOBs), and/or other resources of the FPGA (such as block RAM, processors, multipliers, adders, transceivers).

Another way to disable a programmable logic block is by scaling down the local supply voltage to the block as low as possible, which dramatically reduces the static power consumption of the block. To scale down the local supply voltage in this manner, each independently controlled programmable logic block is powered by a separate switching regulator.

Figure 5:
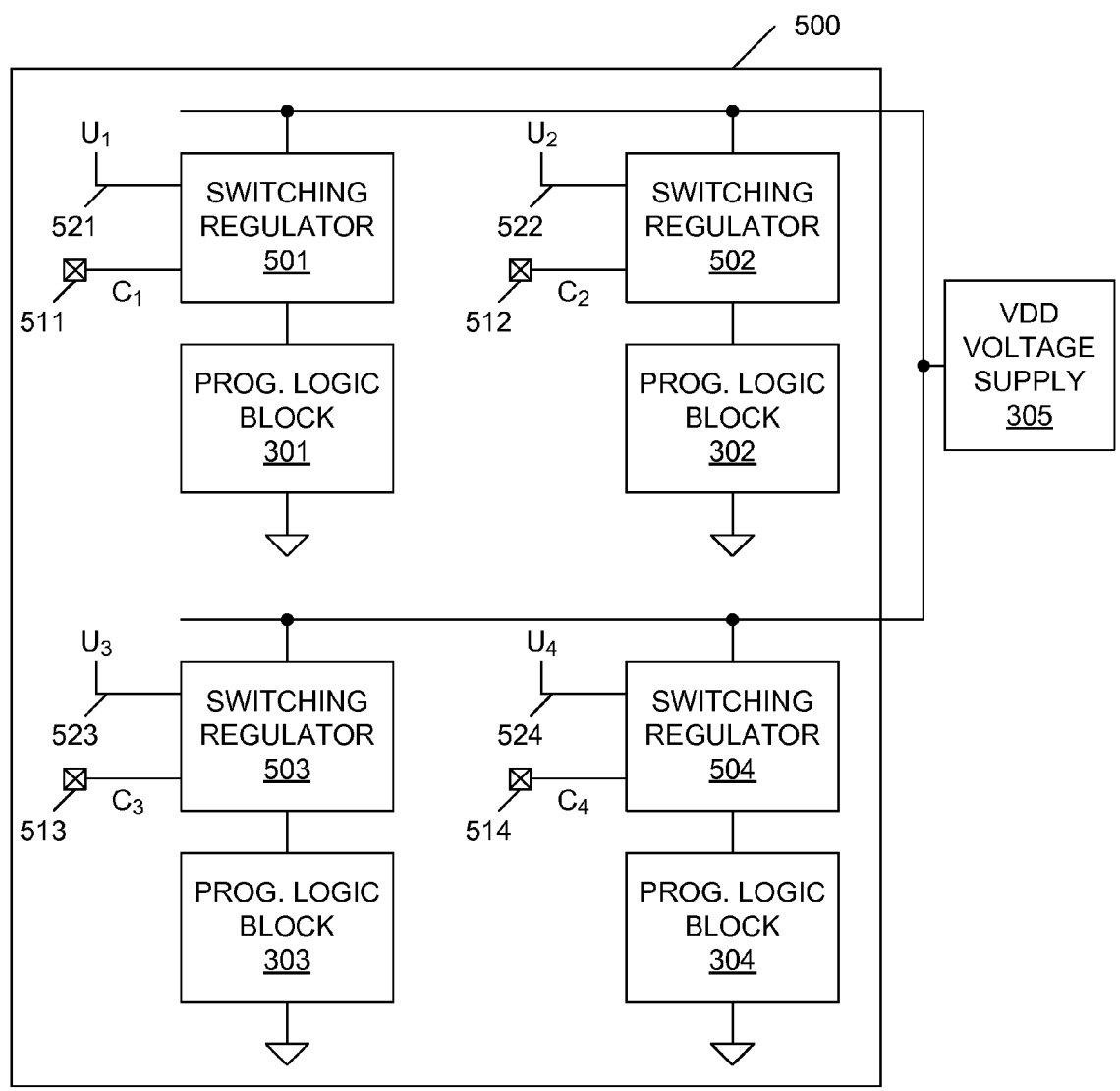
FIG. 5 is a block diagram of a PLD that implements switching regulators in accordance with one embodiment of the present invention.

FIG. 5 is a block diagram of a PLD 500 that implements switching regulators in accordance with one embodiment of the present invention. Similar elements in FIGS. 3 and 5 are labeled with similar reference numbers. Thus, PLD 500 includes programmable logic blocks 301-304 and V$_{DD}$ voltage supply 305. In addition, PLD 500 includes switching regulators 501-504, which are coupled between blocks 301-304, respectively, and V$_{DD}$ voltage supply 305. Switching regulators 501-504 are controlled by control circuits 511-514, respectively. In the described embodiment, switching regulators 501-504 reside on the same chip as blocks 301-304. However, in other embodiments, these switching regulators can be located external to the chip containing blocks 301-304. Switching regulators 501-504 can be programmably tuned to provide the desired supply voltages to the associated programmable logic blocks 301-304. For example, switching regulator 501 can provide a full V$_{DD}$ supply voltage to programmable logic block 301 when this block is used and active. However, switching regulator 501 can further be controlled to provide a reduced voltage (e.g., some percentage of the V$_{DD}$ supply voltage) to programmable logic block 301 when this block is unused or inactive. This reduced voltage may be predetermined (by design or via testing) depending on the desired circuit behavior. For example, this reduced voltage may be the minimum voltage required to maintain the state of the associated blocks. The static power consumption of block 301 is significantly reduced when the supplied voltage is reduced in this manner.

Switching regulators 501-504 are controlled in response to the configuration data values C$_1$-C$_4$ stored in configuration memory cells 511-514, respectively, and the user control signals U$_1$-U$_4$ provided on user control terminals 521-524, respectively. A configuration data value (e.g., C$_1$) having an activated state will cause the associated switching regulator (e.g., switching regulator 501) to provide a reduced voltage to the associated programmable logic block (e.g., block 301). Similarly, a user control signal (e.g., U$_2$) having an activated state will cause the associated switching regulator (e.g., switching regulator 502) to provide a reduced voltage to the associated programmable logic block (e.g., block 502). A configuration data value (e.g., C$_3$) and an associated user control signal (e.g., U$_3$) both having have deactivated states will cause the associated switching regulator (e.g., switching regulator 503) to provide the full V$_{DD}$ supply voltage to the associated programmable logic block (e.g., block 503).

In accordance with one embodiment, configuration data values C$_1$-C$_4$ may be selected at design time, such that reduced voltages are subsequently applied to unused blocks during run time. User control signals U$_1$-U$_4$ may be selected during run time, such that reduced voltages are dynamically applied to inactive blocks at run time. Techniques for distributing multiple programmable down-converted voltages using on-chip switching voltage regulators are described in more detail in U.S. patent application Ser. No. 10/606,619, "Integrated Circuit with High-Voltage, Low-Current Power Supply Distribution and Methods of Using the Same" by Bernard J. New, et al., which is hereby incorporated by reference.

In the embodiment of FIG. 5, the granularity of the voltage scaled programmable logic blocks 301-304 should be fairly large because the overhead associated with switching regulators 501-504 is significant. In an FPGA, each programmable logic block 301-304 would most likely be divided into several clusters of configuration logic blocks (CLBs). The exact size of each programmable logic block may be determined by the desired trade-off among power savings, layout area overhead of the switching regulators, and the speed penalty.

Although the invention has been described in connection with several embodiments, it is understood that this invention is not limited to the embodiments disclosed, but is capable of various modifications, which would be apparent to a person skilled in the art. For example, although the described embodiments included four programmable logic blocks, it is understood that other numbers of blocks can be used in other embodiments. Thus, the invention is limited only by the following claims.

We claim:

1. A method of operating an integrated circuit ("IC"), comprising:
    identifying, using a processor, one or more unused or inactive resources of the IC which will not be used in a circuit design or which are inactive during operation of the IC;
    enabling resources of the IC which will be used in the circuit design; and
    disabling the one or more unused or inactive resources of the IC from one or more power supply terminals in response to configuration values which are stored in memory cells.

2. The method of claim 1, wherein the identifying one or more unused or inactive resources of the IC comprises identifying one or more unused resources of the IC that are unassigned during a place and route process.

3. The method of claim 1, wherein the disabling the one or more unused or inactive resources of the IC comprises disabling one or more resources of the IC which are temporarily inactive during operation of the IC.

4. The method of claim 1, wherein the disabling the one or more unused or inactive resources of the IC comprises providing reduced voltage to the one or more unused or inactive resources of the IC.

5. The method of claim 1, wherein the disabling the one or more unused or inactive resources of the IC comprises disabling, using switches, the one or more unused or inactive resources of the IC.

6. The method of claim 1, wherein the one or more power supply terminals comprise a positive voltage supply terminal or a ground voltage supply terminal.

7. The method of claim 1, further comprising:
    generating a configuration bit stream representing the circuit design; and
    configuring the IC using the configuration bit stream,
    wherein the disabling is performed in response to the configuration values of the configuration bit stream.

8. The method of claim 7, further comprising defining the configuration values during a design time of the IC.

9. The method of claim 1, further comprising:
    defining user controlled signals during run time of the IC; and
    generating the user controlled signals in response to operating conditions of the IC during run time,
    wherein the act of disabling comprises disabling one or more unused or inactive resources of the IC in response to the user controlled signals.

10. The method of claim 1, wherein the act of disabling comprises turning off at least one transistor coupled between the one or more unused or inactive resources and the one or more power supply terminals.

11. The method of claim 1 wherein the one or more unused or inactive resources are one or more unused or inactive programmable logic blocks.

12. An integrated circuit ("IC"), comprising:
    one or more resources;
    one or more power controllers, each of the one or more power controllers coupled to a corresponding one of the one or more resources;
    a power supply coupled to the one or more power controllers; and
    one or more memory cells, each of the one or more memory cells coupled to a corresponding one of the one or more power controllers,
    wherein the one or more memory cells are configured by a configuration bit stream to configure the one or more memory cells in order to enable or disable the corresponding one of the one or more resources based on whether the corresponding one of the one or more resources are unused in a circuit design or inactive during operation of the IC.

13. The IC of claim 12, wherein the one or more power controllers are one or more switches or one or more switching regulators.

14. The IC of claim 12, wherein the one or more resources are inactive if the one or more resources are temporarily inactive during operation of the IC.

15. The IC of claim 12, wherein the power supply comprises a positive voltage supply or a ground voltage supply.

16. The IC of claim 12, further comprising user logic to generate control signals to disable the one or more resources during operation of the IC.

17. The IC of claim 12, wherein the memory cells are configured during a design time of the IC.

18. The IC of claim 12, wherein the one or more resources of the IC are one or more programmable logic blocks.

19. A method to reduce a power consumption of an integrated circuit ("IC"), comprising:
    assigning components of a circuit design to resources of the IC;
    identifying, using a processor, one or more of the resources of the IC that are unused;
    during a design time, enabling one or more of the resources of the IC which will be used in the circuit design; and
    during the design time, disabling the one or more unused resources of the IC from one or more power supply terminals.

20. The method of claim 19, wherein the disabling the one or more unused resources of the IC comprises disabling the one or more unused resources of the IC using one or more switches.

* * * * *